United States Patent [19]

Volut

[11] Patent Number: 4,623,948
[45] Date of Patent: Nov. 18, 1986

[54] SWITCHING AID DEVICE

[75] Inventor: Serge Volut, Villeurbanne, France

[73] Assignee: Cem- Compagnie Electro-Mecanique et Compagnie, Paris, France

[21] Appl. No.: 638,140

[22] Filed: Aug. 6, 1984

[30] Foreign Application Priority Data

Aug. 5, 1983 [FR] France .................. 83 12961

[51] Int. Cl.$^4$ .............................. H01H 9/30
[52] U.S. Cl. ........................... 361/13; 361/6; 361/8
[58] Field of Search ............... 361/2, 6, 8, 13

[56] References Cited

U.S. PATENT DOCUMENTS

| | | | |
|---|---|---|---|
| 2,849,659 | 8/1958 | Kesselring | 361/4 |
| 3,184,619 | 5/1965 | Zydney | 361/13 X |
| 3,309,570 | 3/1967 | Goldberg | 361/6 X |
| 4,392,172 | 7/1983 | Foley et al. | 361/8 |

FOREIGN PATENT DOCUMENTS 45-18502 6/1970 Japan ..................... 361/13

Primary Examiner—A. D. Pellinen
Assistant Examiner—Jeffrey A. Gaffin
Attorney, Agent, or Firm—Sughrue, Mion, Zinn, Macpeak and Seas

[57] ABSTRACT

The switching aid device includes, in the case of a main static switch, (1), a switching aid capacitor (10), parallel connected to the main static switch (1) via a loading diode (11) and, parallel connected to the latter, a series set up formed by an anti-return diode (12), primary winding (13) of transformer (14) of which secondary winding (15) is connected to an energy recovery circuit on an electrical power source (4) via diode (16) and an auxiliary static switch (17) fitted with control means (20) for closing the auxiliary switch in presence of an inverse voltage at the terminals of loading diode (11) and for opening the auxiliary switch in absence of such voltage.

8 Claims, 5 Drawing Figures

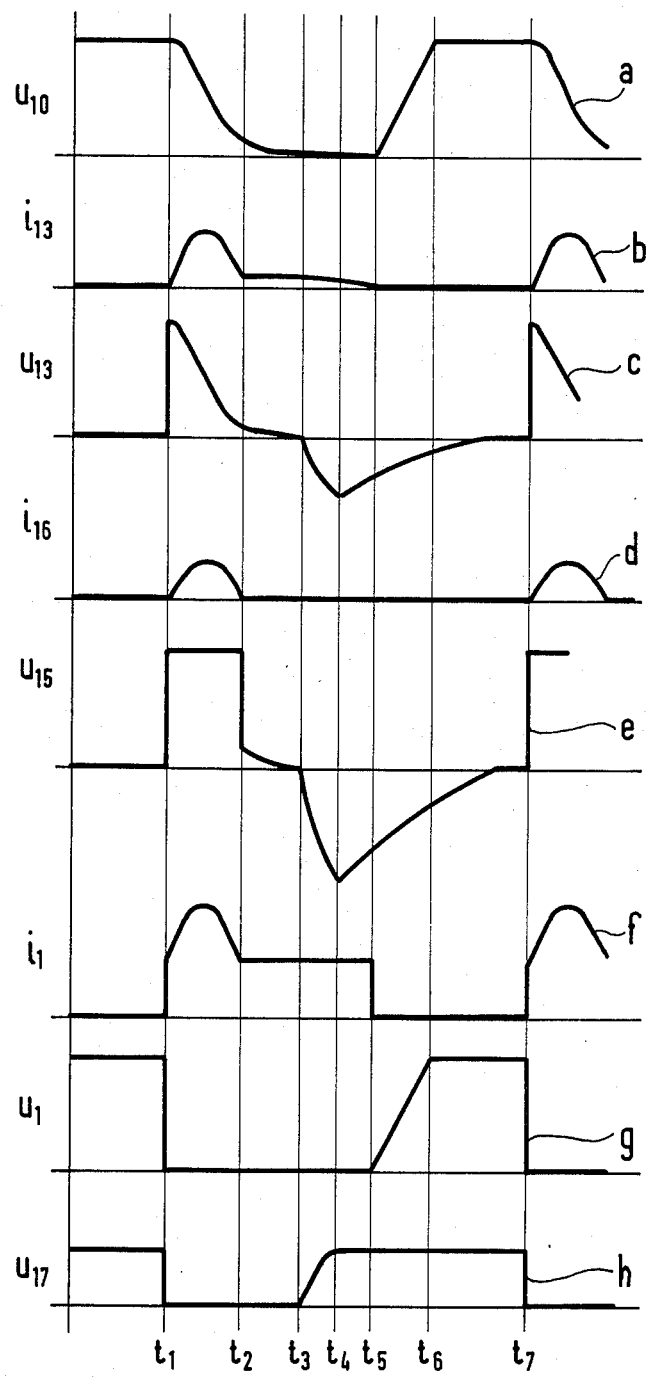

4,623,948

SWITCHING AID DEVICE

BACKGROUND OF THE INVENTION

The present invention relates to switching aid circuits of static switches in electrical power converters such as, for example, choppers or undulators.

Such static switches are in general made of transistors, simple thyristors, or G.T.O. (Gate turn off) thyristors.

A switching aid circuit is often associated to these components to limit the overvoltages and the voltage rise speed of their terminals at the moment of opening. In general, it houses a parallel connected capacity on the static switches which is loaded at each static switch opening and is unloaded in other moments.

The simplest switching aid circuit is made of a dipole which is parallel connected on the static switch and which includes the said capacity series connected with a diode located in the same direction as the static switch and shunted by a resistor. The diode constitutes the capacitor loading circuit whereas the resistor and the static switch form the capacitor unloading circuit.

This configuration has a major disadvantage: the power stored in the capacitor at each static switch opening is entirely dissipated in the resistor by joule effect at the moment of static switch closing and this entails deterioration of the power conversion efficiency. If such losses can easily be dissipated in static converters having relatively low power, it is not the case when the static switches must cut currents of several hundred (even thousands) ampers under voltages which can exceed one thousand volts. In addition, the losses in such devices being proportional to the switching frequency, this configuration can only be used for relatively low frequencies.

A second disadvantage consists in the fact that the rise speed of the capacity unloading current in the static switch is very high (this rise speed being only limited by spurious inductances of the installation) and provokes important switching losses.

Another more intricate configuration of a switching aid circuit allowing reduction of losses by recovery of the switching aid capacitor load, and especially a circuit used in an undulator, is described in page 1589 of the Intenational Conference on Power Electronics Report, Tokyo, April 1983. This circuit includes, in series with the resistor of the switching aid capacitor unloading circuit, the primary winding of a transformer of which the secondary winding is connected to an energy recovery circuit on the power source by means of a rectifier assembly.

The presence of the unloading resistor which remains mandatory to limit the duration of the primary winding current magnetizing the transformer when the load of the switching aid capacitor have been cancelled and when the transformer primary winding is looped on itself via the capacitor loading diode, deteriorates the recovery efficiency of such device.

SUMMARY OF THE INVENTION

The present invention is intended to correct the defect mentioned hereabove to obtain a switching aid device having a good efficiency and able to operate at high frequencies.

This invention relates to a switching aid device for a static switch called a main switch. This device includes a switching aid capacitor connected in parallel with the main static switch via a loading diode arranged in the same direction as the main static switch and an unloading circuit of the switching aid capacitor including, series connected at the terminals of the loading diode, an anti-return diode arranged an opposite direction in relation to the loading diode, a primary winding of a transformer having a secondary winding connected to an energy recovery circuit on an electrical power source via at least one rectifier element and an auxiliary static switch, which becomes leading only in the presence of an inverse voltage at the terminals of the loading diode.

This switching aid device may be adapted to protection of two series connected static main switches by replacing the loading diode by two series connected loading diodes with a common point connected to that of the static main switches and by replacing the switching aid capacitor by two series connected capacitors located on both sides of the loading diodes and connected at the ends of the two static main switch assemblies.

The transformer has the advantage of a secondary winding to primary winding ratio neighbouring or equal to twice that of the electrical power supply voltage in which is carried out recovery on the voltage which is born, at lock status, by the static main switch or the assembly of the two static main switches assisted by the device.

According to a preferred construction mode, the static auxiliary switch is provided with a switching aid circuit.

BRIEF DESCRIPTION OF THE DRAWINGS

Several examples of the invention are given hereunder and will emphasize other characteristics and advantages of the invention. Such description is related to the various drawings, in which:

FIG. 2 is an assembly of time function diagram illustrating operation of the switching aid circuit shown in the previous figure.

DETAILED DESCRIPTION OF THE INVENTION

Figure 1:
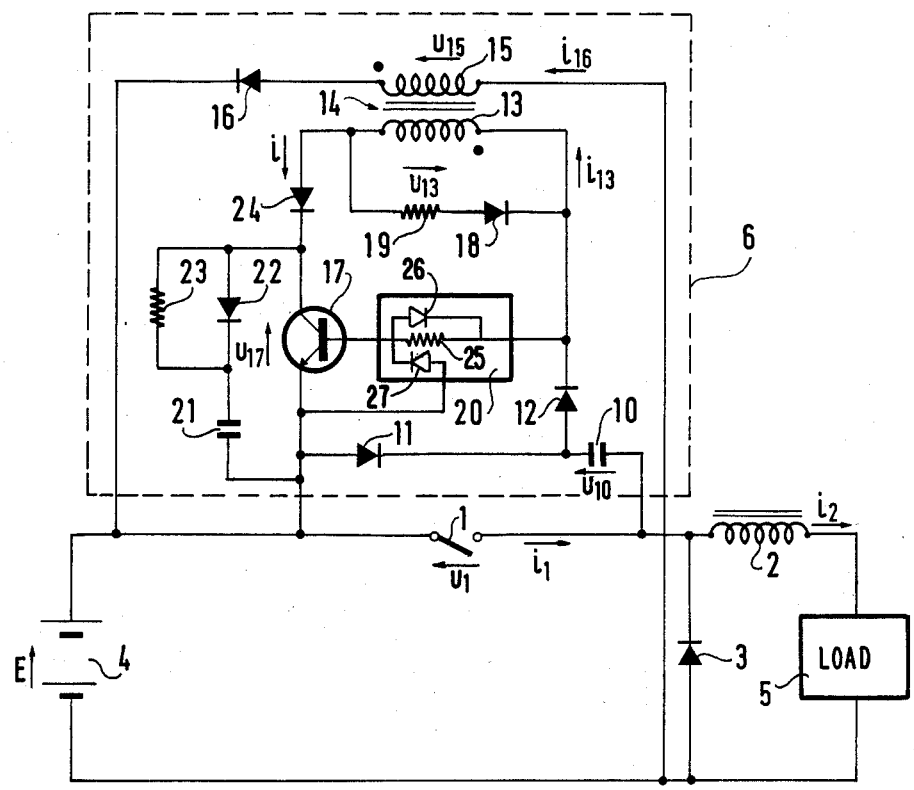
FIG. 1 represents the electrical diagram of a switching aid circuit according to the invention and fitted on a voltage chopper.

FIG. 1 shows a voltage chopper made out by a static switch 1, a smoothing inductance 2, and a free-wheeling diode 3 inserted between a power supply source 4 and a load 5. A switching aid circuit 6 equips the static switch 1 which will be called hereunder main switch and which can be a transistor, a simple or G.T.O. thyristor. Its control circuit is not represented, it is based on current chopper technology and is not part of the invention.

The switching aid circuit 6 includes a switching aid capacitor 10, parallel connected with the main static switch 1 via a loading diode 11 arranged in the same leading direction as the main static switch 1.

Parallel connected with the loading diode 11, there is an unloading circuit for the switching aid capacitor 10 formed by a series connection of the first anti-return diode 12 and switching aid capacitor 10 and arranged in the opposite leading direction of loading diode 11, a primary winding 13 of transformer 14 of which secondary winding 15 is connected to the terminals of the electrical power source 4 via diode 16 arranged in the locking direction in relation to the electrical power supply source 4 and an auxiliary static switch constituted by the emitter-collector space of transistor 17 controlled at the level of the siwtch.

The transformer 14 has a secondary winding to primary winding ratio neighbouring or equal to two. Its primary winding is fitted with, a demagnetizing circuit connected at its terminals and formed by a free-wheeling diode 18 series connected with a dissipative resistor 19.

The NPN type transistor 17 is connected by its emitter to the anode of loading diode 11. It is fitted with a three-pole control circuit 20 connected between its base, its emitter and the cathode of the anti-return diode 12 and a switching aid circuit made out by a capacitor 21 connected in parallel with its emitter-collector space via loading diode 22 arranged in the same leading direction as this space and shunted by a dissipative resistor 23.

A second anti-return diode 24 is inserted between the primary winding 13 of transformer 14 and transistor collector 17.

Three distinct operating stages are observed for this switching aid circuit:

a first stage of restitution of the power stored in the switching aid capacitor 10, starting when the main static switch 1 closes, a second stage for dumping the residual current of the switching aid capacitor 10 unloading circuit coming immediately after the first stage, and a third stage for actual switching aid, taking place during opening of the main static switch 1, switching aid capacitor 10 being initially unloaded and taking its load at the terminals of the main static switch 1.

The diagrams in FIG. 2 represent the evolution of the currents and voltages at the terminals of certain elements of the circuit in FIG. 1 during such operating stages. The diagram represents voltage $U_{10}$ at terminals of the switching aid capacitor 10, diagram b represents current $i_{13}$ in the primary winding of transformer 14, diagram c represents voltage $U_{13}$ at the terminals of primary winding of transformer 14, diagram d represents current $i_{16}$ in the secondary winding of transformer 14, diagram e represents voltage $U_{15}$ at the terminals of the secondary winding of transformer 14, diagram f represents current $i_1$ in the main static switch 1, diagram g represents voltage $U_1$ at the terminals of main static switch 1 and diagram h represents the voltage at terminals of the emitter-collector space of transistor 17.

Before time $t_1$, main static switch 1 is opened, and switching aid capacitor 10 is loaded. A current $I_2$ is established in inductance 2 and circulates through load 5 and free-wheeling diode 3.

At time $t_1$, the main static switch 1 is closed. The first operating stage of the switching aid circuits starts. The load voltage $U_{10}$ of the switching aid capacitor 10 is applied via the main static switch 1 and anti-return diode 12 to the base control circuit 20 of transistor 17 and then the latter becomes leading. From this results circulation of a current $i_{13}$ through the primary winding 13 of the transformer, through transistor 17, and main static switch 1, capacitor 10 and anti-return diode 12 and 24. From that moment, voltage $U_{13}$ at the terminals of primary winding 13 of the transformer becomes equal to the direct voltage of the power supply source 4. A positive direct voltage $U_{15}$ is induced at the terminals of the secondary winding 15, thus provoking presence of a current $i_{16}$ circulating in this secondary winding and diode 16, and returning to the power supply source. As the secondary winding 15 has twice the number of turns of primary winding 13, the fictitious voltage at the terminals of transformer 14 stray inductance, seen from primary winding 13, has a value equal to half the direct voltage of the power supply source 4. During this operating stage, the equivalent unloading circuit of switching aid capacitor 10 is constituted by the transformer stray inductance seen from the primary winding, in series with a voltage source having half the value of the power supply source 4 which is connected in opposition. Voltage $U_{10}$ at the terminals of switching aid capacitor 10 decreases also according to the quasi sine-shaped path, its unloading current $i_{13}$ presenting the shape of a pulse fed back on the secondary winding 15 of transformer 14 with half intensity.

At time $t_2$, current $i_{16}$ is cancelled and diode 16 is locked, marking thus the end of recovery and beginning of the second operating stage. Current $i_{13}$ is then practically equal to the current magnetizing the transformer primary winding 13. Voltage $U_{10}$ at terminals of switching aid capacitor 10 is not yet cancelled but has a very low value since most of the power stored in capacitor 10 has been restored to the power supply source 4. Capacitor 10 continues unloading via primary winding of transformer 13 which presents high impedance due to locking of diode 16 which opens its secondary winding and also via base control circuit 20.

At time $t_3$, the voltage between loading diode 11 anode and anti-return diode 12 cathode is cancelled and entails locking of transistor 17 by the base control circuit 20 and opening of transformer 14 primary circuit. At the same moment, voltages $U_{13}$ and $U_{15}$ at the terminals of transformer 14 windings are inverted and transformer 14 magnetizing power is transferred in switching aid capacitor 21 of transistor 17 and in resistor 19 of transformer 14 demagnetizing circuit. Capacitor 21 is loaded until time $t_4$ which marks the end of transistor 17 locking and remains loaded until the next unlocking of transistor 17, while anti-return diode 24 prevents unloading via transformer 14 primary winding.

At time $t_5$, the third operating stage of the switching aid circuit starts and it corresponds to opening of the main static switch 1. Current $i_2$ in inductance 2 continues to circulate via loading diode 11 and switching aid capacitor 10 until time $t_6$ when the voltage at terminals of capacitor 10 reaches the value of the power supply source 4 voltage. Then free-wheeling diode 3 takes over and is crossed by current $i_2$.

At time $t_7$, the circuit is at the same stages as at time $t_1$ and another cycle starts again.

Figure 3:
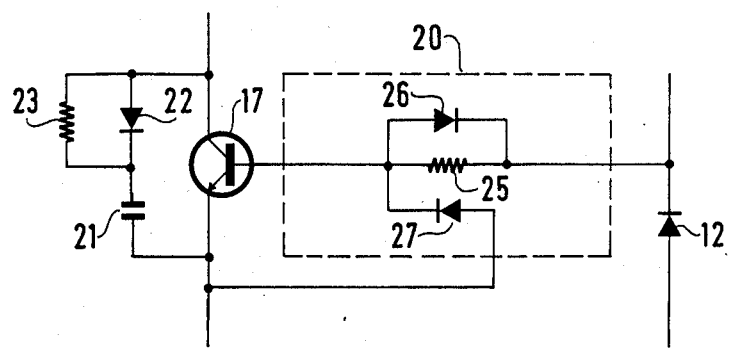
FIG. 3 is an electrical diagram of a control circuit used in the circuit of FIG. 1.

FIG. 3 gives a diagram example for the base control circuit 20 of transistor 17 in its environment. This base control circuit includes a resistor 25 connected between the base of transistor 17 and the cathode of anti-return diode 12, a diode 26 in parallel with resistor 25, its cathode being connected to the cathode of the anti-return diode 12, and a diode 27, parallel connected with the base-emitter space of transistor 17 in the opposite leading direction.

Resistor 25 provides to the base of transistor 17 its saturation current when the voltage of the anti-return diode 12 cathode becomes positive in relation to the emitter of the transistor, that is when the loading diode 11 is submitted to an inverse voltage. Diode 26 accelerates the locking process for transistor 17 by shunting resistor 25 when the voltage of the anti-return diode 12 cathode decreases under the transistor 17 base potential. Diode 27 protects the base-emitter space of transistor 17 against reverse voltage and accelerates locking of the latter by providing to the load current of the switching aid capacitor 21 a shunting circuit in parallel with loading diode 11 and anti-return diode 12.

In addition to improved recovery efficiency, it is important to note that the switching aid circuit which has just been described, has the following advantage: the voltage $U_{17}$ stress on the emitter-collector space of transistor 17 is only due to the relative values of the switching aid capacitor 21 and of resistor 19 on the magnetizing circuit of transformer 14. Therefore, convenient choice of such elements will allow use of a transistor which can bear, in locked status, a much lower voltage than the direct voltage of the power supply source 4 which must cut off main static switch 1. This advantage has a relevant economical effect for an important value of the direct supply voltage.

Figure 4:
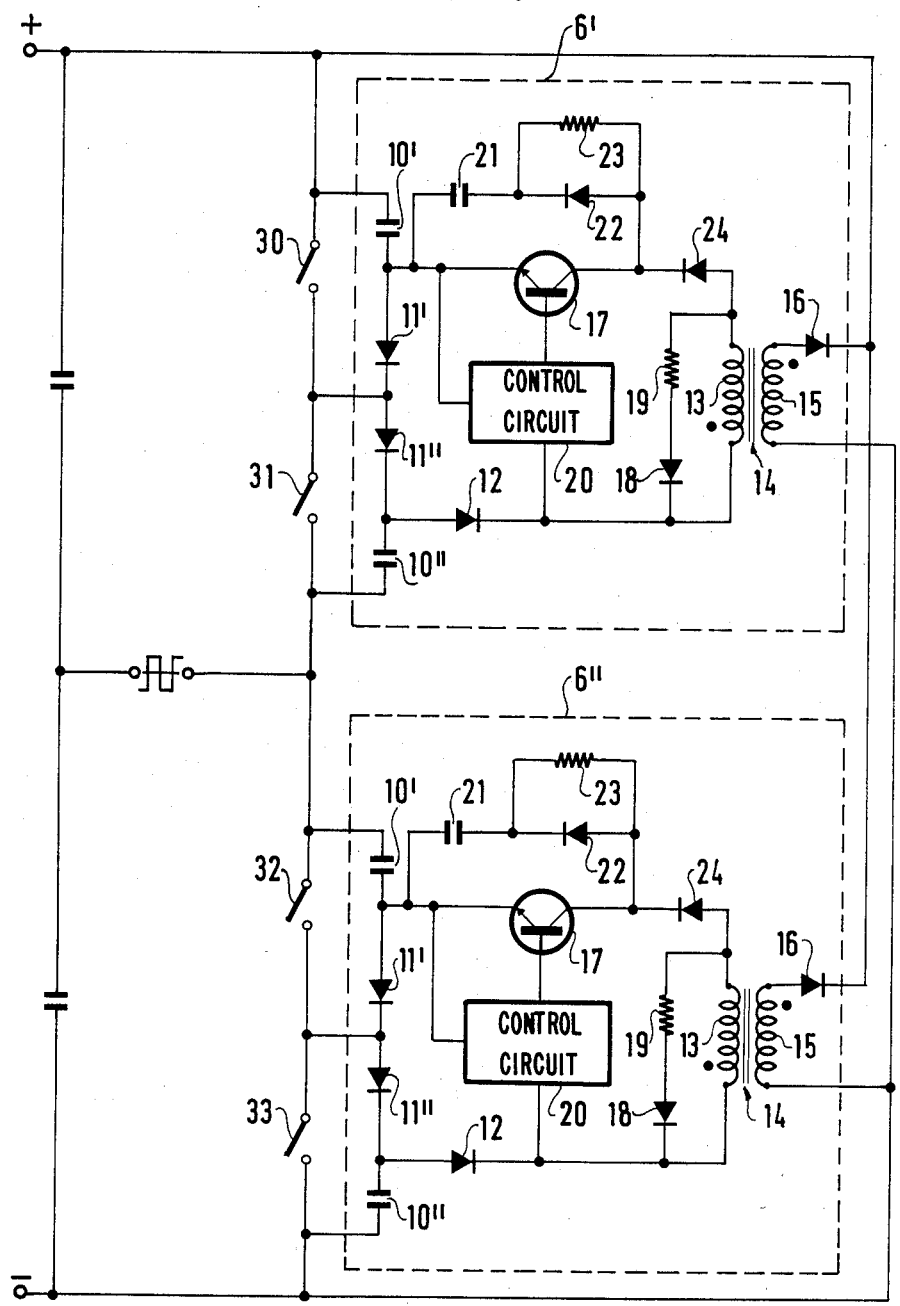
FIG. 4 is the diagram of a single-phase undulator in which the static main switches are fitted with switching aid devices according to the invention and FIG. 5 is an electrical diagram of a switching aid device according to the invention and adapted to four main static switches series connected to make out a static master switch.

The switching aid circuit previously described can easily be adapted to protection of two series connected main static switches. FIG. 4 represents such a configuration in a single-phased undulator of which each half phase is carried out by means of two static switches 30, 31 or 32, 33 which are series connected. In this example, the two static switches 30, 32 or 31, 33 of a same half phase, are protected by a switching aid circuit respectively 6' or 6" respectively which is deduced from the circuit of FIG. 1 by replacing the loading diode 11 by two diodes 11' and 11" series connected, their common point being connected to that of the main static switches, and by replacing switching aid capacitor 10 by two capacitors 10' and 10" used for respective main static switches and series connected on both sides of the loading diodes 11' and 11", their free ends being connected to the ends of the two main static switch assemblies. The other elements remain in place and keep the same item numbers as in FIG. 1.

The switching aid circuit for a group of two main static switches which has just been described, also operates when the two static switches are not synchronous. As a matter of fact, capacitors 10' and 10" can be individually unloaded, the unloading current of each capacitor passing through the loading diode of the other one, 11" or 11', before reaching the actual unloading circuit.

In the case presented in FIG. 4, the load is connected at the middle point of the power supply source where the recovery takes place. Each of the two switch groups undergoes, in locked status, the voltage at which the recovery is carried out. As in the previous example, it is necessary to provide, for transformers 14, a secondary winding to primary winding ratio neighbouring or equal to two.

Figure 5:
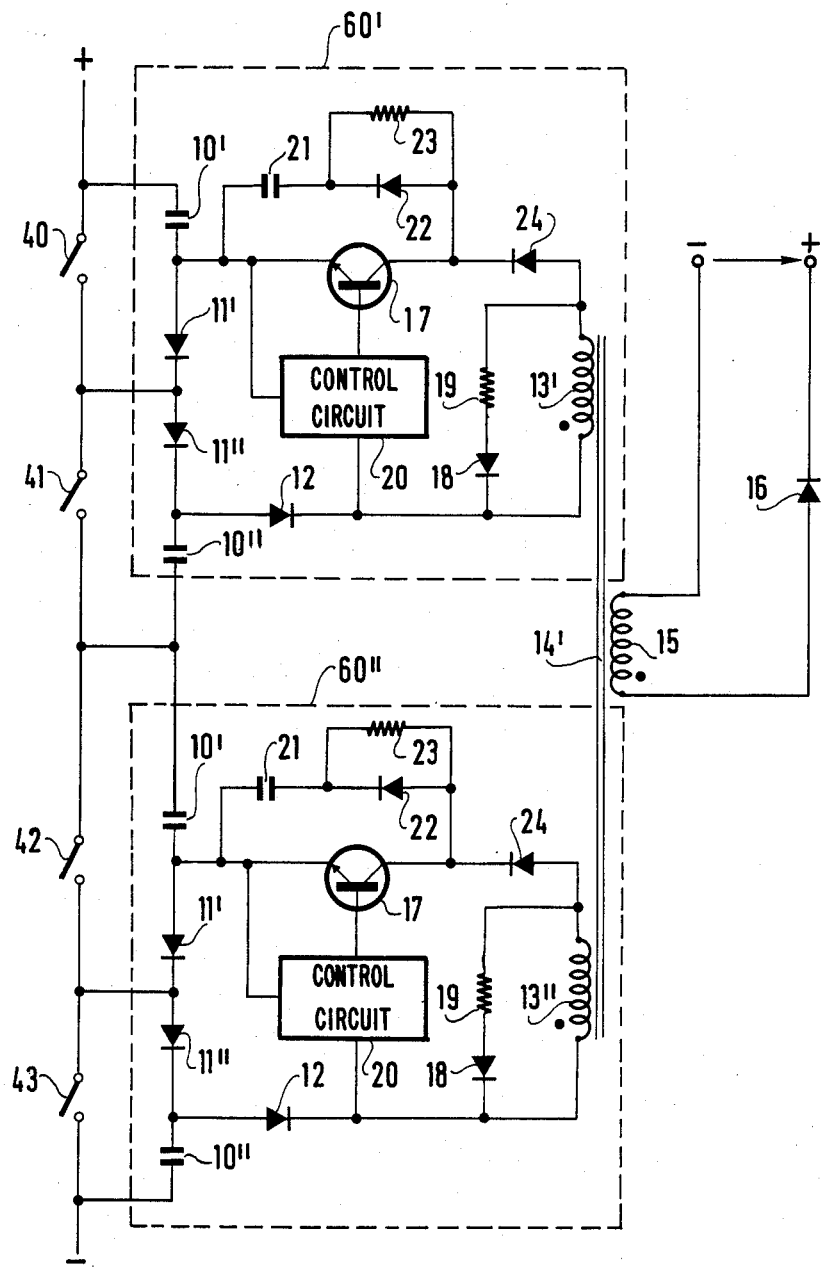

FIG. 5 represents another example in which a switch is formed by series connection of four static switches 40, 41, 42, 43 protected two-by-two by two switching aid circuits 60' and 60" analogous to those of FIG. 4. In this example, since the four main static switches 40, 41, 42 and 43 are controlled in perfect synchronism, a transformer 14' is used in common to the two switching aid circuits 60' and 60" with two independent primary windings 13' and 13", as well as common magnetic circuit and secondary winding 15.

In the most frequent case, the power source where recovery takes place is the power supplying the line of main static switches 40, 41, 42, 43 via a load. Each group of two main static switches 40, 41 or 42, 43 undergoes at lock status, half the voltage of the power supply source where recovery takes place so that it is necessary to make for a secondary winding 15 have four times the number of turns of primary windings 13' or 13".

In general, when this time of set up is used to protect two by two, n main static switches series connected and supplied via a load by means of a power supply source having a direct voltage E and when recovery takes place in another direct voltage source V, it is necessary to provide a transformer having a secondary winding with about 2 n V/E times more turns than the number of primary winding turns.

Without departing from the scope of the invention, it is possible to modify certain arrangements or to replace certain means by equivalent means. It is especially possible to replace transistor 17 by any element able to operate as controlled switch.

I claim:

1. A switching arrangement including a switching aid device and a main static switch, said switching aid device including:

a switching aid capacitor connected in parallel with said main static switch via a loading diode arranged to conduct current in the same direction as said main static switch; and an unloading circuit of said switching aid capacitor connected in parallel with said loading diode and including a primary winding of a transformer having its secondary winding connected to an energy recovery circuit on an electric power source via at least one recitifier, said switching aid capacitor unloading circuit further including, series-connected with said primary winding, a static auxiliary switch and control means for closing said static auxiliary switch in the presence of an inverse voltage at the terminals of said loading diode and for opening said auxiliary switching in the absence of such inverse voltage.

2. A switching arrangement according to claim 1, wherein said main static switch is connected between a load and said electrical power source, characterized in that the ratio of turns of said secondary winding to said primary winding is two.

3. A switching arrangement according to claim 1, wherein said switching aid device further comprises a demagnetizing circuit connected to said primary winding and formed of a free-wheeling diode series-connected with a dissipative resistor.

4. A switching arrangement according to claim 1, wherein said unloading circuit further includes an anti-return diode inserted between said primary winding and said switching aid capacitor.

5. A switching arrangement according to claim 1, wherein said unloading circuit further includes an anti-return diode connected between said primary winding and said auxiliary static switch.

6. A switching arrangement including a switching aid device and two series-connected main static switches, said switching aid device including two switching aid capacitors each connected in parallel with one of said main static switches via a respective loading diode arranged for conducting current in the same direction as the respective main static switch, said loading diodes being installed so that they have a common point connected to the common point of the two main static switches, said switching aid device including an unloading circuit for the switching aid capacitors, said unloading circuit comprising a series connection, across the terminals of the assembly of two loading diodes, of a primary winding of a transformer and an auxiliary static switch, said transformer having a secondary winding connected to an energy recovery circuit on an electrical power source via at least one rectifier, and said auxiliary static switch having control means for closing said auxiliary static switch in the presence of an inverse voltage at the terminals of the two loading diodes and for opening said auxiliary static switch in the absence of such an inverse voltage.

7. A switching arrangement according to claim 6, further including n groups of switches, each group including two main static switches, said groups being series connected and simultaneously controlled to constitute a master switch, each said group of two main static switches being provided with said switching aid device with the transformers of each said switching aid device sharing a common magnetic circuit and common secondary winding.

8. A switching arrangement according to claim 7, wherein said n groups of series connected main static switches are connected between a load and an electrical power source, characterized in that the turns ratio of said secondary winding to said primary winding is equal to 2n.

* * * * *